(12) United States Patent
Weldin et al.

(10) Patent No.: US 6,815,956 B2
(45) Date of Patent: Nov. 9, 2004

(54) AUTOMATIC HI-POT, MEGOHMETER AND CONTINUITY, CIRCUIT TESTER

(75) Inventors: Larry G. Weldin, Anderson, SC (US); Darin P. Magera, Simpsonville, SC (US)

(73) Assignee: Westinghouse Air Brake Technologies Corporation, Wilmerding, PA (US)

( * ) Notice: Subject to any disclaimer, the term of this patent is extended or adjusted under 35 U.S.C. 154(b) by 0 days.

(21) Appl. No.: 10/353,459

(22) Filed: Jan. 29, 2003

(65) Prior Publication Data

US 2004/0145374 A1 Jul. 29, 2004

(51) Int. Cl.[7] .............................................. G01R 31/08
(52) U.S. Cl. ....................... 324/536; 324/511; 324/522; 324/555; 324/73.1
(58) Field of Search ................................ 324/511, 512, 324/522, 551, 555, 73.1

(56) References Cited

U.S. PATENT DOCUMENTS 5,710,503 A * 1/1998 Sideris et al. ............... 324/431
6,054,865 A * 4/2000 Bald et al. ................... 324/551
6,515,484 B1 * 2/2003 Bald et al. ................... 324/551

* cited by examiner

*Primary Examiner*—Vincent Q. Nguyen
(74) *Attorney, Agent, or Firm*—James Ray & Associates (57) ABSTRACT

Provided is an apparatus and method used to perform automatic high potential (hi-pot), megohmeter and continuity, circuit test which includes a power source connected to a central processing unit (cpu) having a floppy drive, a hard drive, an analog to digital (A/D) printed circuit board (pcb), and a predetermined number of digital I/O pcb's, a hi-pot device, and a power supply. A data entry device is connected to the cpu for providing input thereto. A display device is provided for displaying data. A hi-pot device is connected to the A/D pcb and to a digital I/O pcb for providing an input voltage of a predetermined magnitude. A multiplexer is connected to the power supply and to a digital I/O pcb and the hi-pot device for communicating the input voltage to a predetermined number of external circuits to provide testing of the external circuits.

19 Claims, 13 Drawing Sheets

AUTOMATIC HI-POT, MEGOHMETER AND CONTINUITY, CIRCUIT TESTER

FIELD OF INVENTION

The present invention relates, in general, to rather commonly used high voltage test equipment and, more particularly, the invention relates to an apparatus for automated testing of individual wires or networked circuits. Still more specifically, this invention relates to an automatic high potential megohmeter and continuity circuit tester.

BACKGROUND OF THE INVENTION

It will be appreciated that, in railway and mass and/or rapid transit operations, it is common practice to perform high potential (hi-pot) testing on individual wires as well as on networked circuits.

Applying a voltage of a predetermined magnitude between two points that are electrically isolated from each other in order to determine that minimum standards of the quality of electrical isolation between those points exist is commonly known as a hi-pot test. The hi-pot test typically involve applying a high voltage, for example 1500 volts, across two points of an isolated wire for a predetermined minimum amount of time. Any arc appearing between these two points indicates defective isolation in the wire. If no arc appears within the predetermined minimum voltage applied time, the isolation is deemed to be functioning correctly.

The nature of hi-pot testing demands that the high voltage be applied between the isolated points for at least a predetermined time period. This insures adequate stressing of the insulating material, used for providing isolation, by the applied high voltage in order to cause a break down of weak insulation, damaged wires, or wires that may have been installed improperly during an assembly process, which indicate a breakdown in isolation. Arcing within the insulation, which is used to provide proper isolation, indicates such breakdown. If the high voltage is applied for less than the predetermined amount of time, it is possible that a defective isolation will not have time to breakdown; therefore, it will appear to the testing apparatus that the test results are normal even though such defective isolation may exist.

High voltage test apparatus detect defects in electrical isolation by sensing an increase in current through a faulty isolated wire by causing the arcing. This increase in current will cause the test apparatus to sound an alarm, or in the case of an automatic test apparatus, to activate a reject test cycle.

SUMMARY OF THE INVENTION

In one aspect the present invention provides an apparatus used to perform an automatic high potential (hi-pot), megohmeter and continuity, circuit test. The apparatus comprises a power source connected to a central processing unit (cpu), a hi-pot means, and a power supply means. The cpu contains a floppy drive, a hard drive, an analog to digital (A/D) printed circuit board, and a predetermined number of digital I/O printed circuit boards. There is a data entry means connected to the cpu for providing input into the cpu. Displaying predetermined data from the cpu is provided by a visual display means. Also included is a hi-pot means connected to the A/D printed circuit board and to at least one of the predetermined number of digital I/O printed circuit boards, contained in the cpu, for providing a predetermined voltage of a predetermined magnitude. The apparatus further includes a multiplexer means connected to the power supply and to at least one of the predetermined number of digital I/O printed circuit boards and the hi-pot means for receiving a predetermined voltage of a predetermined magnitude and for communicating a predetermined quantity of signals indicative of a predetermined voltage of a predetermined magnitude. Finally it includes a predetermined number of external circuits connected to the multiplexer means for providing two-way communication of a predetermined quantity of signals.

In another aspect the present invention provides a method used to perform an automatic high potential (hi-pot), megohmeter and continuity, circuit test. The method comprises the steps of energizing a cpu, a hi-pot means, and a power supply means. Test parameters are determined and entered into the cpu. Generating in the cpu a digital control signal indicative of the test parameters and communicating the digital control signal to a hi-pot means. The hi-pot means generates an analog signal indicative of the digital control signal and communicates it to the A/D printed circuit board. The cpu verifies the analog signal and then utilizes the A/D printed circuit board to generate a digital signal. A high voltage signal is generated in the hi-pot means and is communicated it to a multiplexer means. The multiplexer utilizes the high voltage signal to perform a predetermined test on an external circuit. Upon completion of the predetermined test the multiplexer generates a predetermined test result signal indicative of the predetermined test, and communicates the predetermined test result signal to a predetermined digital I/O printed circuit board. The predetermined digital I/O printed circuit board generates a display signal upon receipt of the predetermined test result signal and communicates the display signal to a visual display means for visually displaying test results.

OBJECTS OF THE INVENTION

It is, therefore, one of the primary objects of the present invention to provide an automatic hi-pot, megohmeter and continuity, circuit tester that assures product quality.

It is also an object of the present invention to provide an automatic hi-pot, megohmeter and continuity, tester that improves reliability through the elimination of operator error.

An additional object of the present invention is to provide an automatic hi-pot, megohmeter and continuity, circuit tester that greatly reduces test times while improving accuracy.

Another object of the present invention is to provide an automatic hi-pot, megohmeter and continuity, circuit tester that provides a higher level of safety for workers.

These and various other objects and advantages of this invention will become apparent after a full reading of the following detailed description, particularly, when read in conjunction with the attached drawings as described below and the appended claims.

BRIEF DESCRIPTION OF THE PRESENTLY PREFERRED AND ALTERNATE EMBODIMENTS OF THE INVENTION

Prior to proceeding with the more detailed description of the present invention it should be noted that, for the sake of clarity, identical components, which have identical functions have been designated by identical reference numerals throughout the several views illustrated in the drawings.

In the presently preferred embodiment, this invention provides an apparatus and method to allow for network circuit testing which is easily programmable for many different circuit configurations, and is fully customizable. It eliminates operator error and allows for easy and accurate test data storage and retrieval.

Referring now to FIGS. 1 through 13, the apparatus used to perform an automatic high potential (hi-pot), megohmeter and continuity, circuit test, generally designated as 10, utilizes test parameter data entered into a central processing unit (cpu) generally designated 20, to automatically perform tests thereby increasing circuit test quality. The apparatus includes a power source 42 for energizing the cpu 20, a hi-pot means 26, and a power supply means 28. Such power source 42 is normally a 120 volt alternating current (ac) source.

Figure 1:
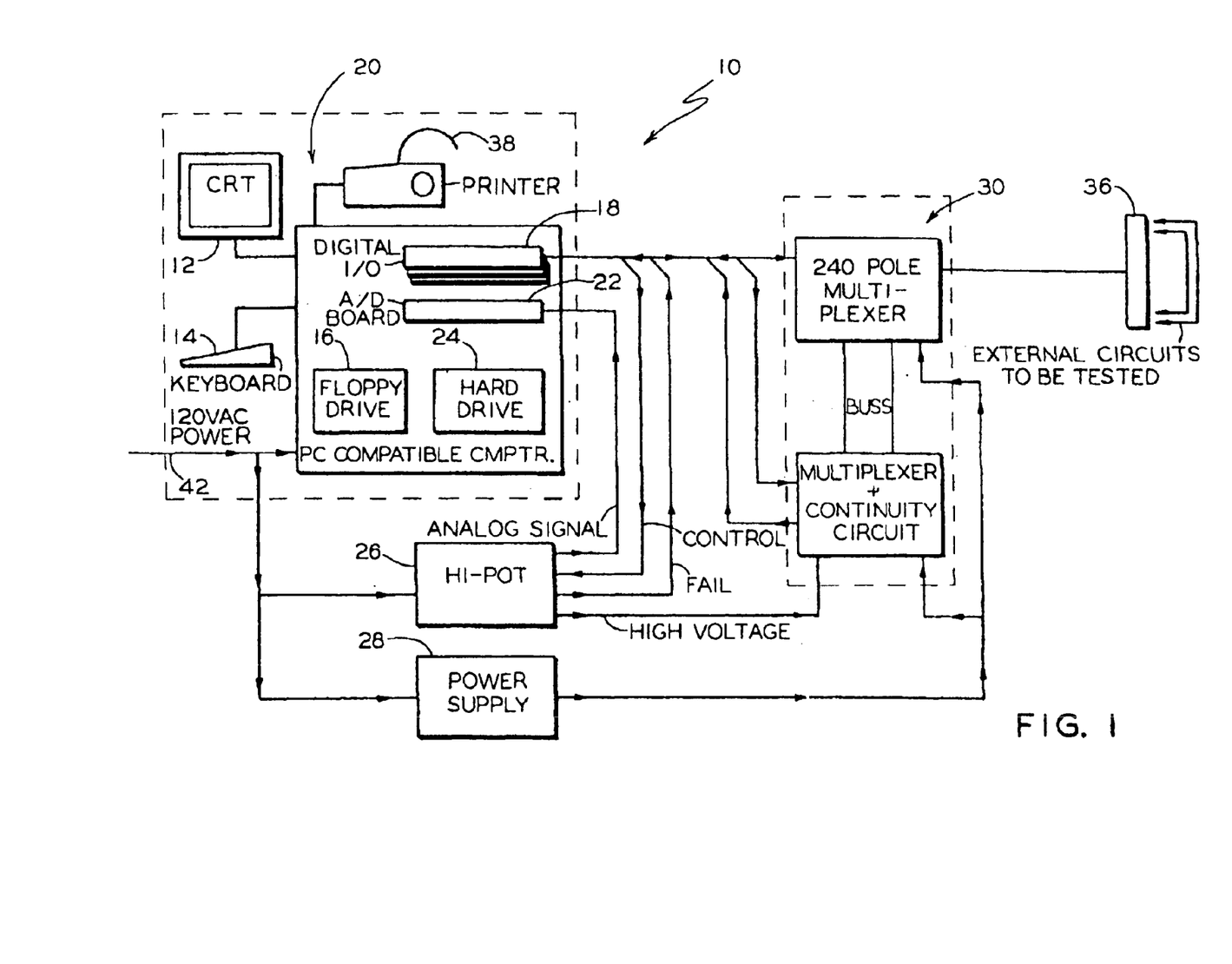
FIG. 1 is a block diagram of a presently preferred embodiment of an automatic hi-pot, megohmeter and continuity, circuit test.
Figure 2:
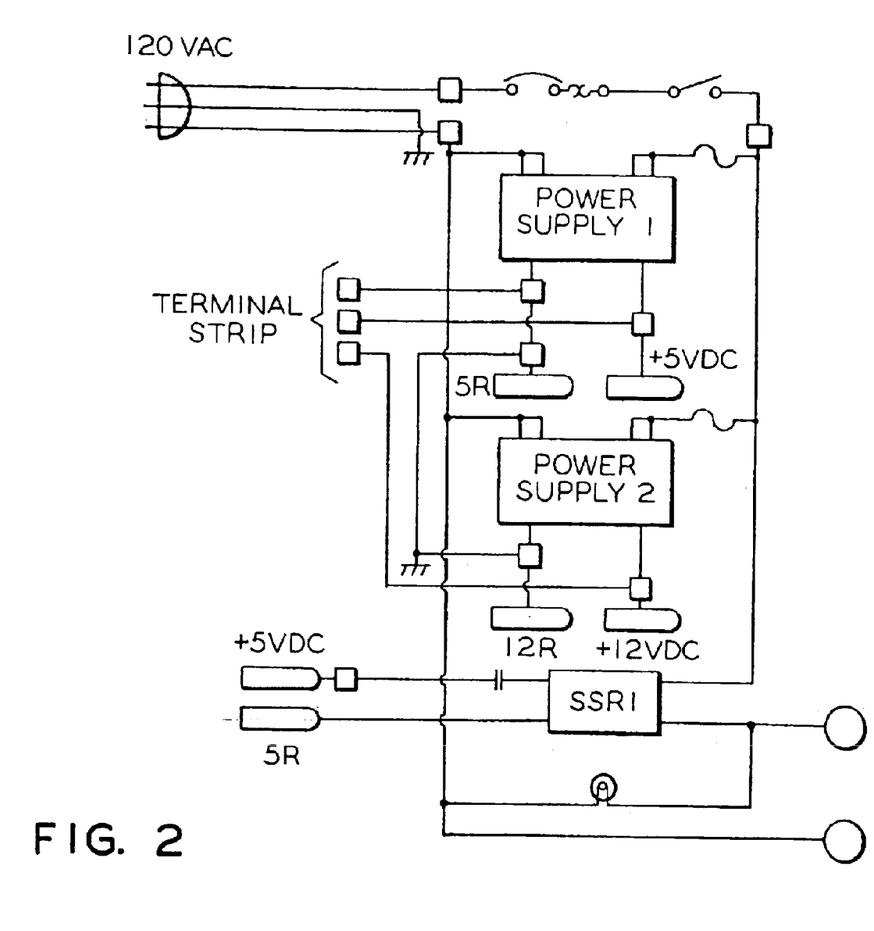
FIG. 2 is an electrical schematic of a power supply.
Figure 3:
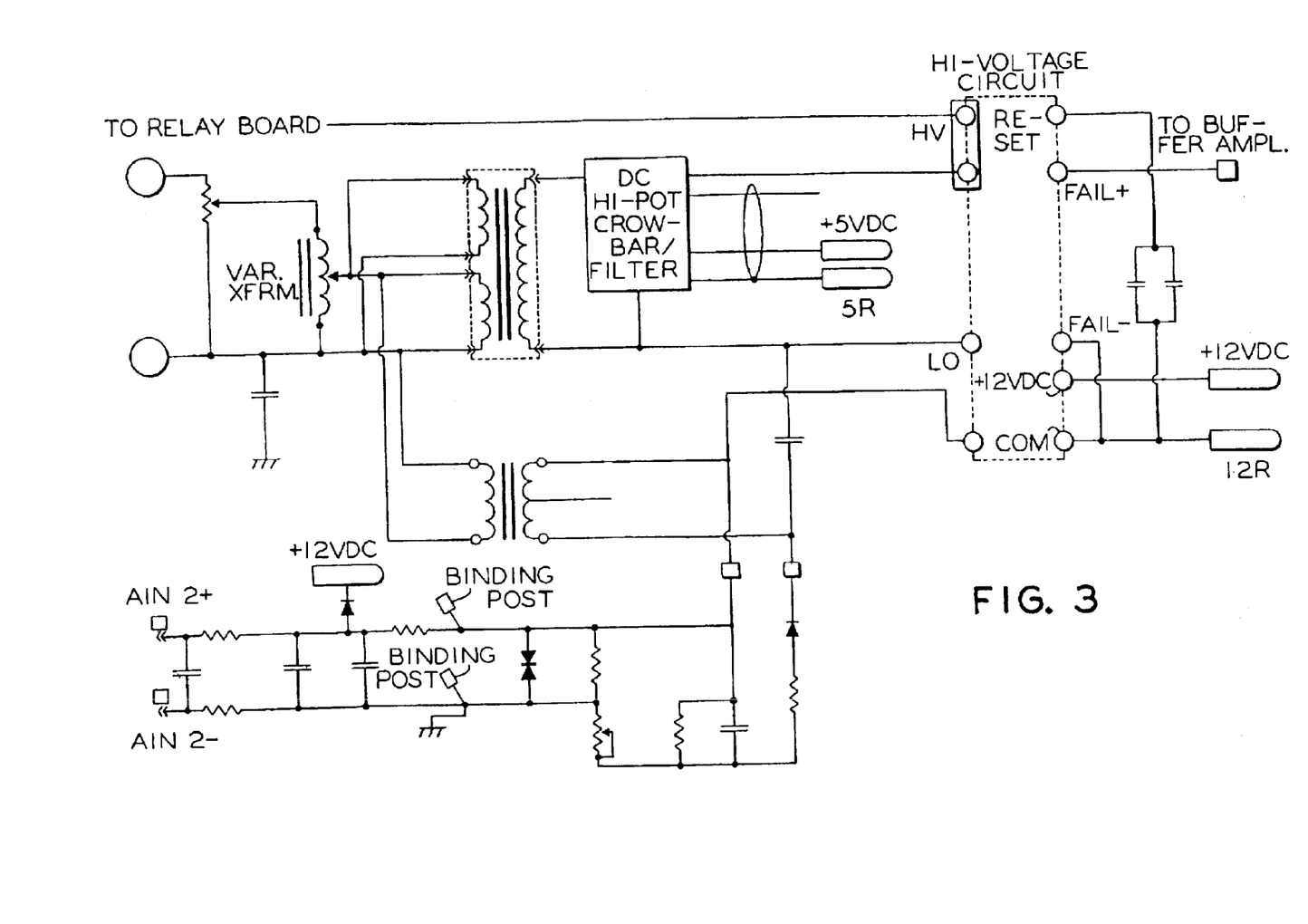
FIG. 3 is a continuation of the electrical schematic in FIG. 2.
Figure 4:
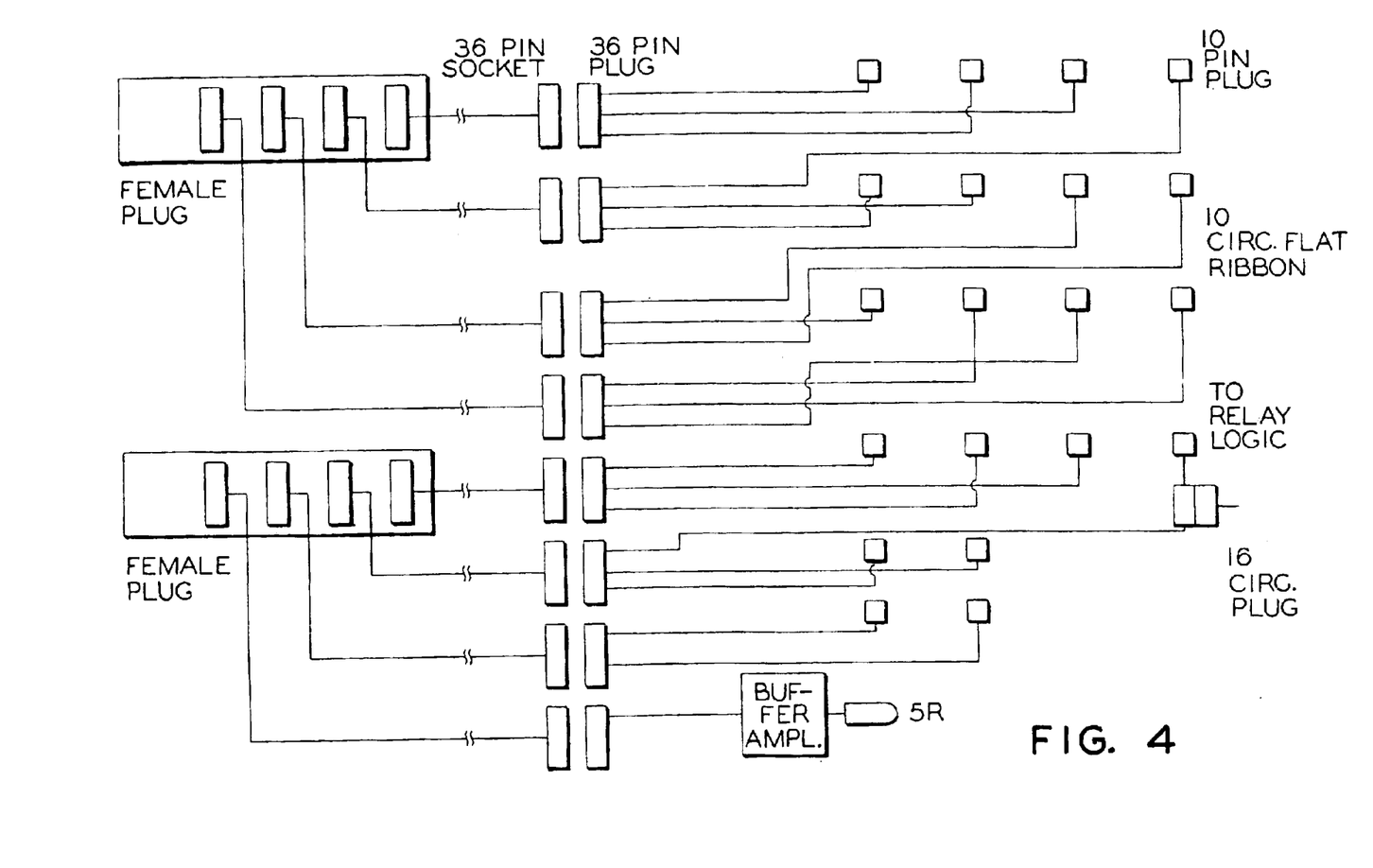
FIG. 4 is an electrical schematic of the digital I/O printed circuit boards.
Figure 5:
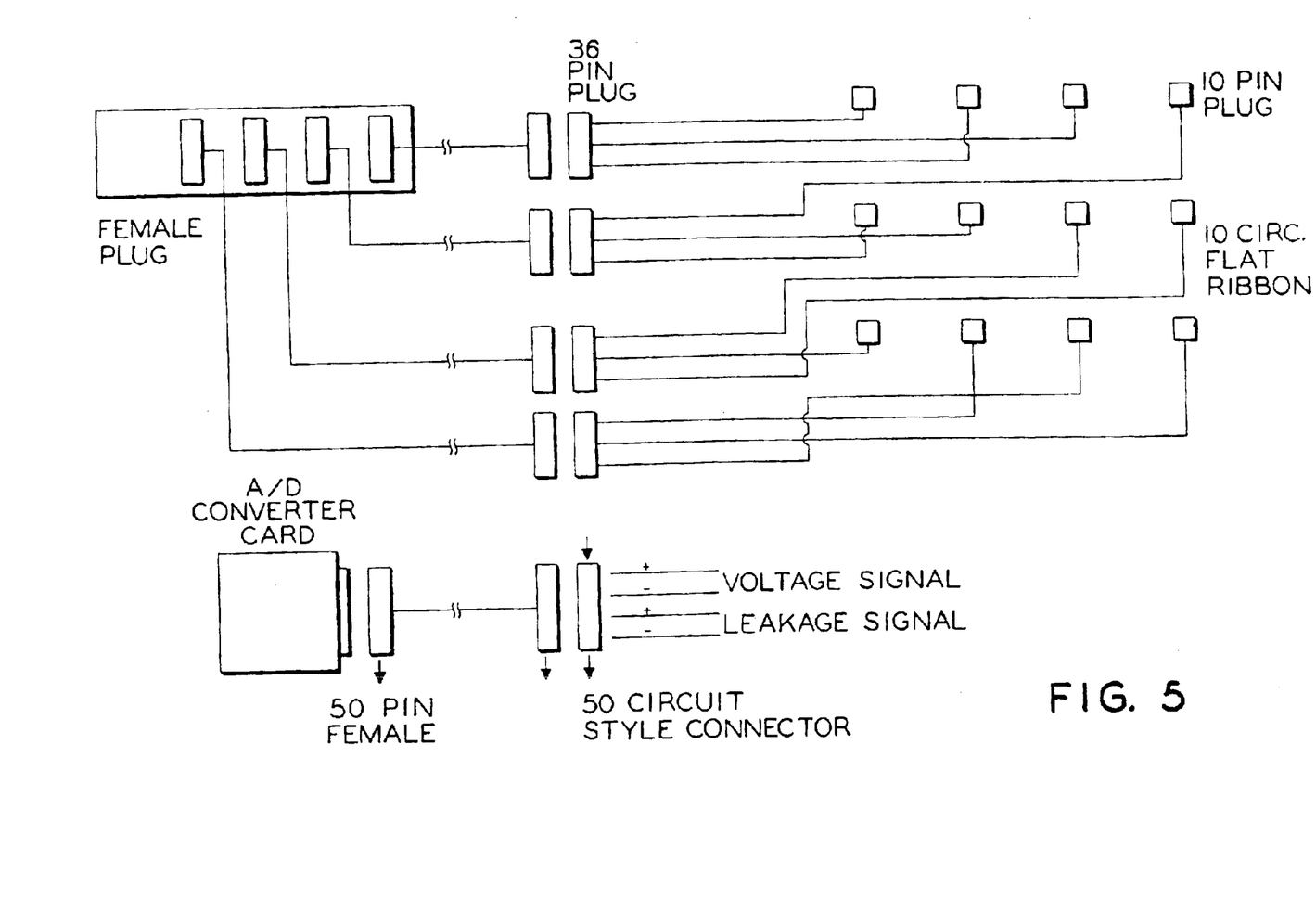
FIG. 5 is a continuation of the electrical schematic for the digital I/O printed circuit boards, and it also includes the electrical schematic of the A/D printed circuit boards.
Figure 6:
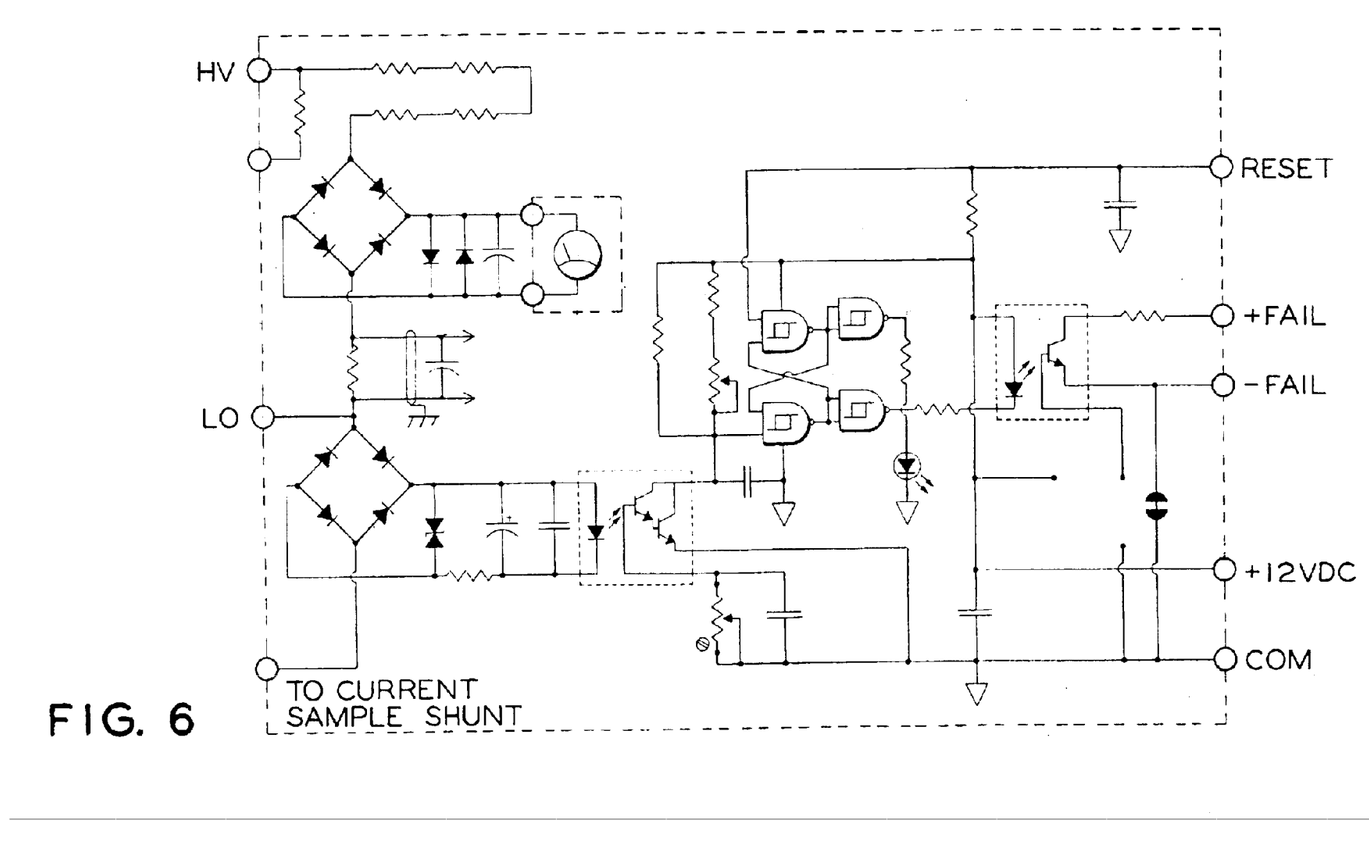
FIG. 6 is an electrical schematic of the hi-pot means.
Figures 7A, 7B:
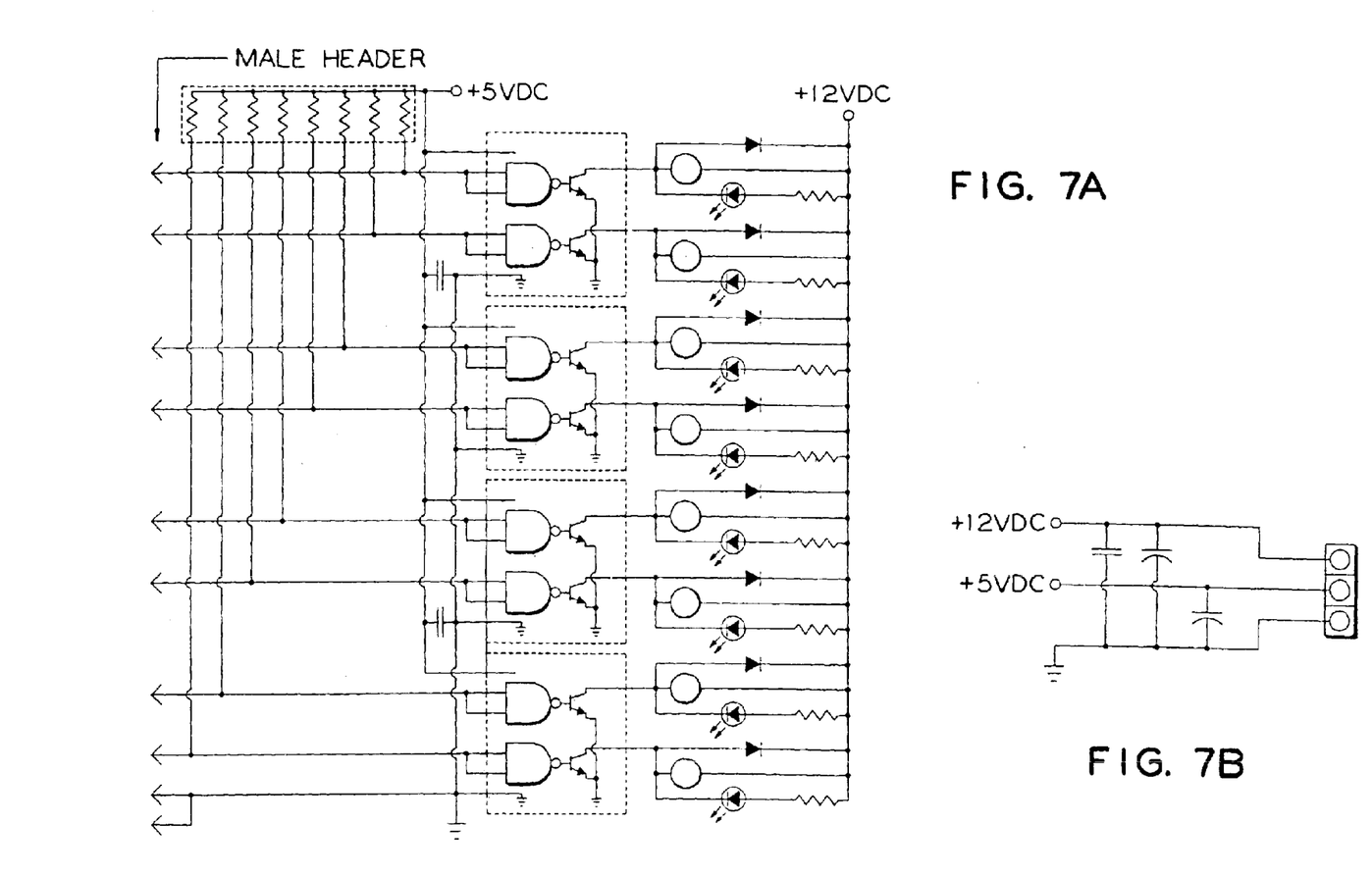
FIGS. 7 through 11 are an electrical schematic of the is multiplexer means.
Figure 8:
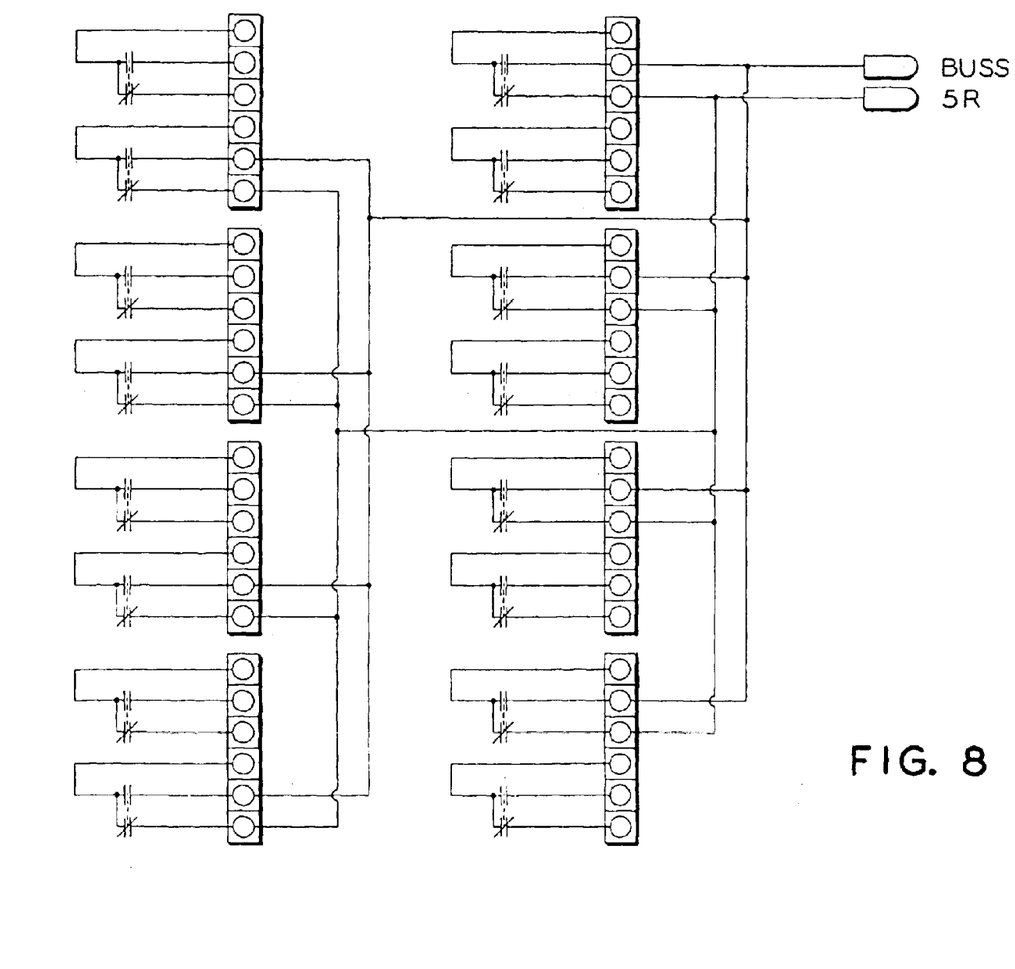
Figure 9:
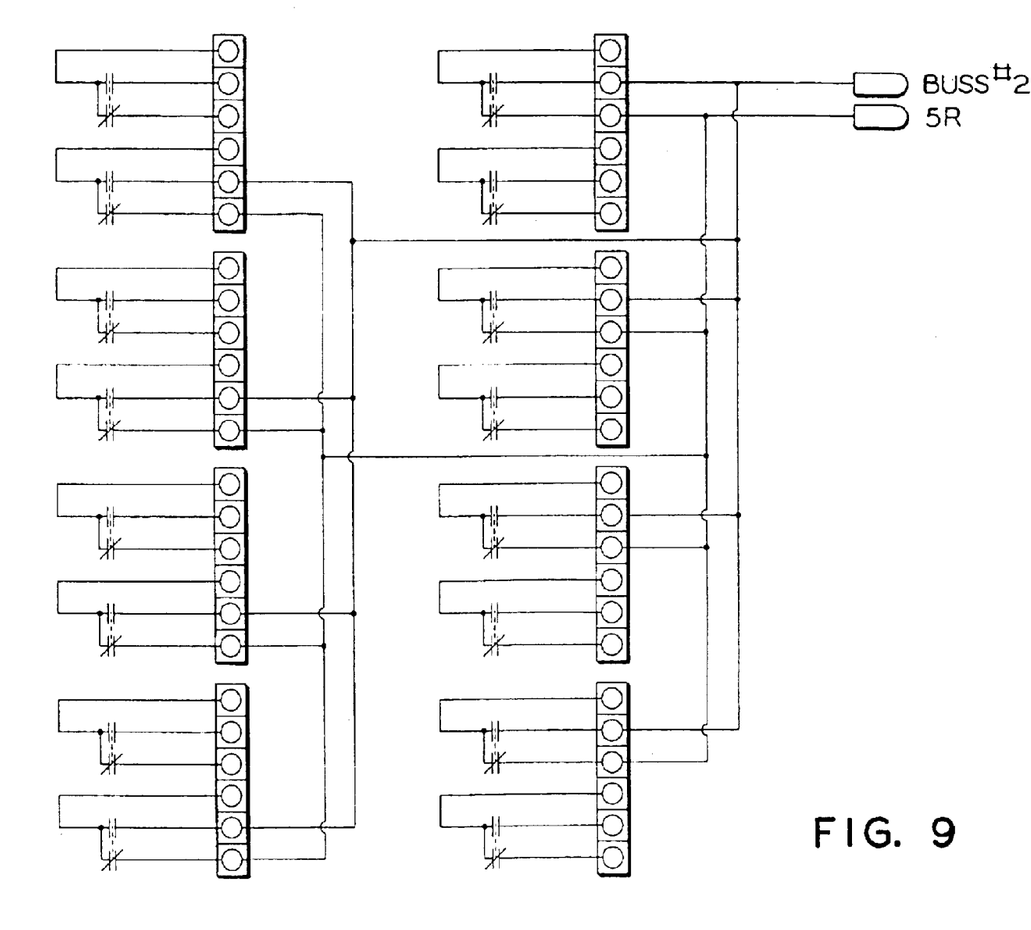
Figure 10:
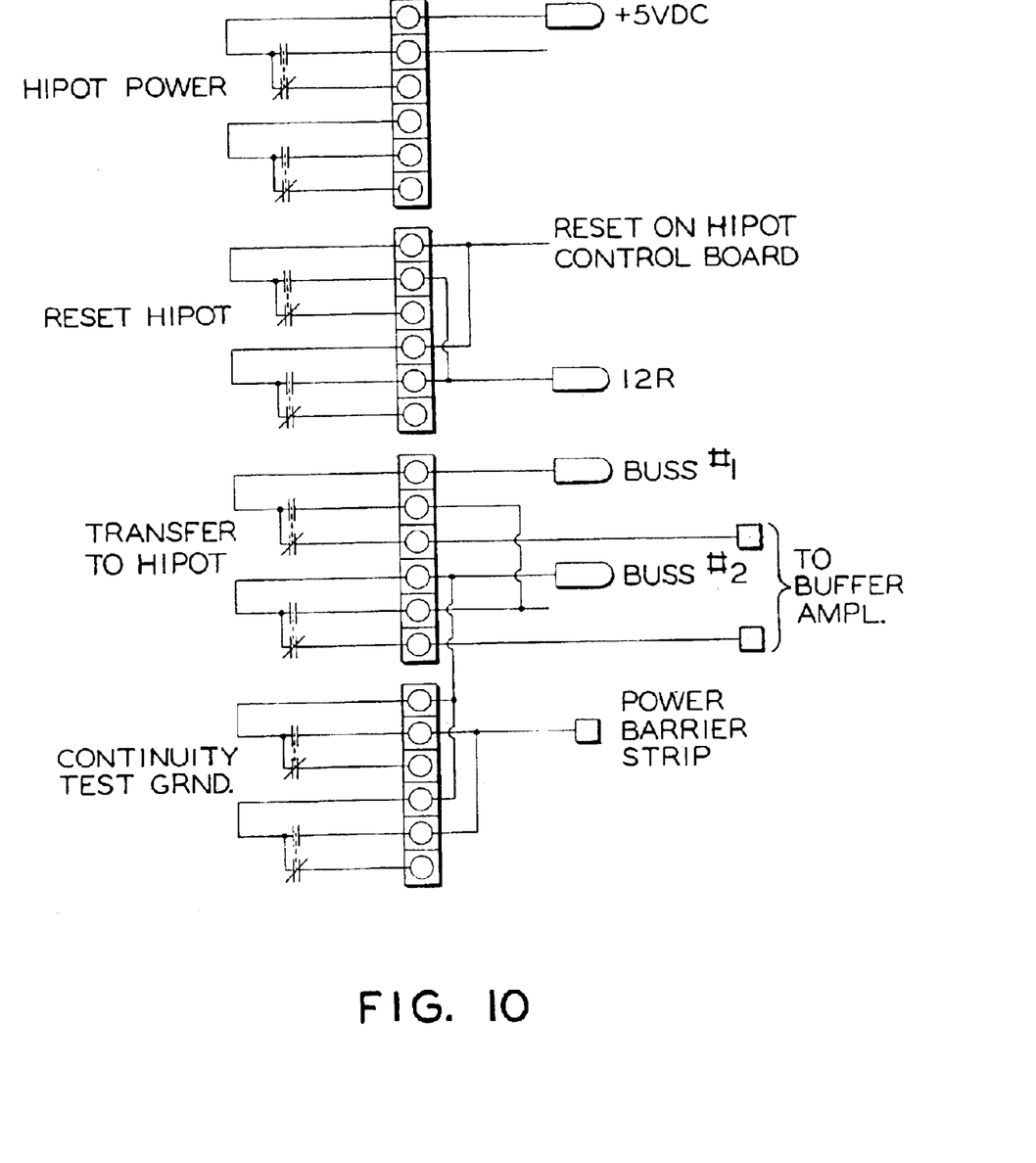
Figure 11:
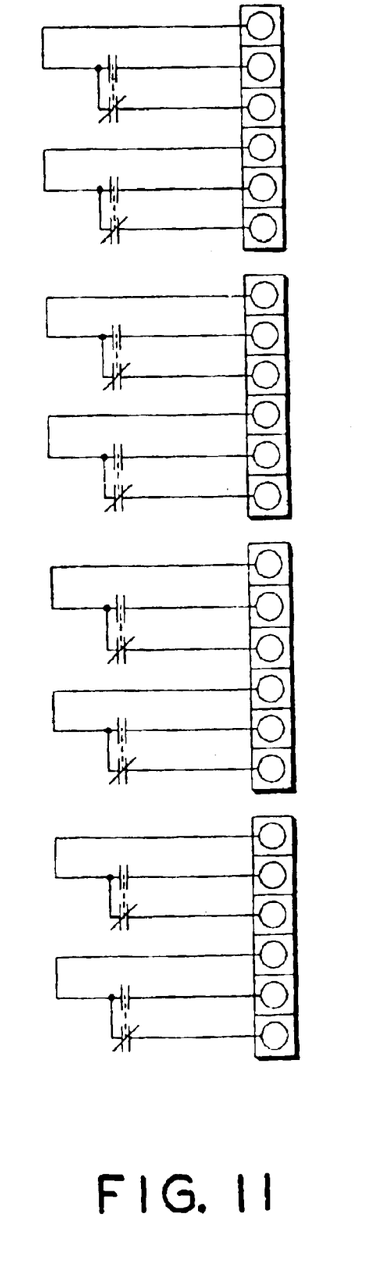
Figure 12:
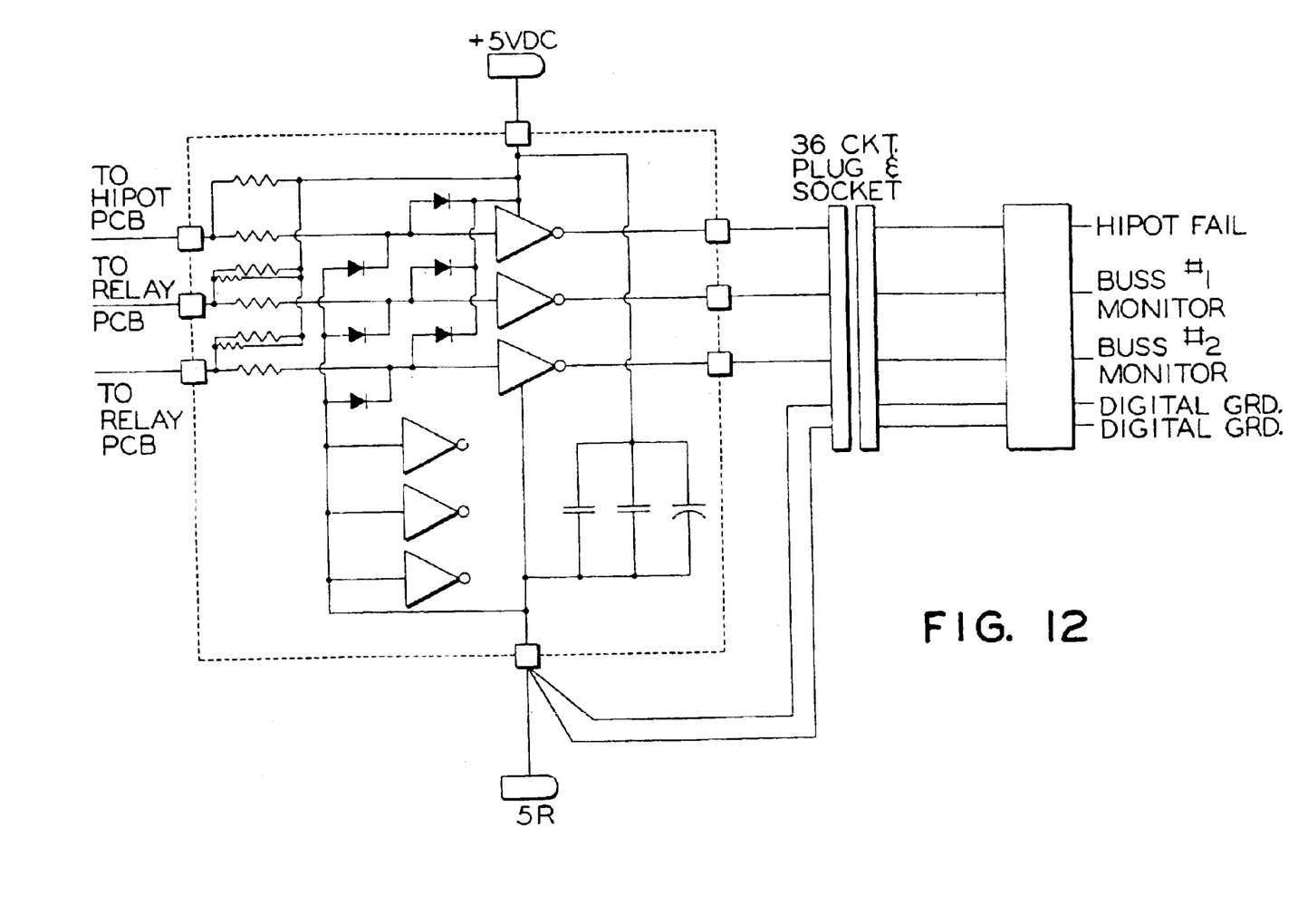
FIG. 12 is an electrical schematic of the interface between the hi-pot means and the digital I/O printed circuit board.
Figure 13:
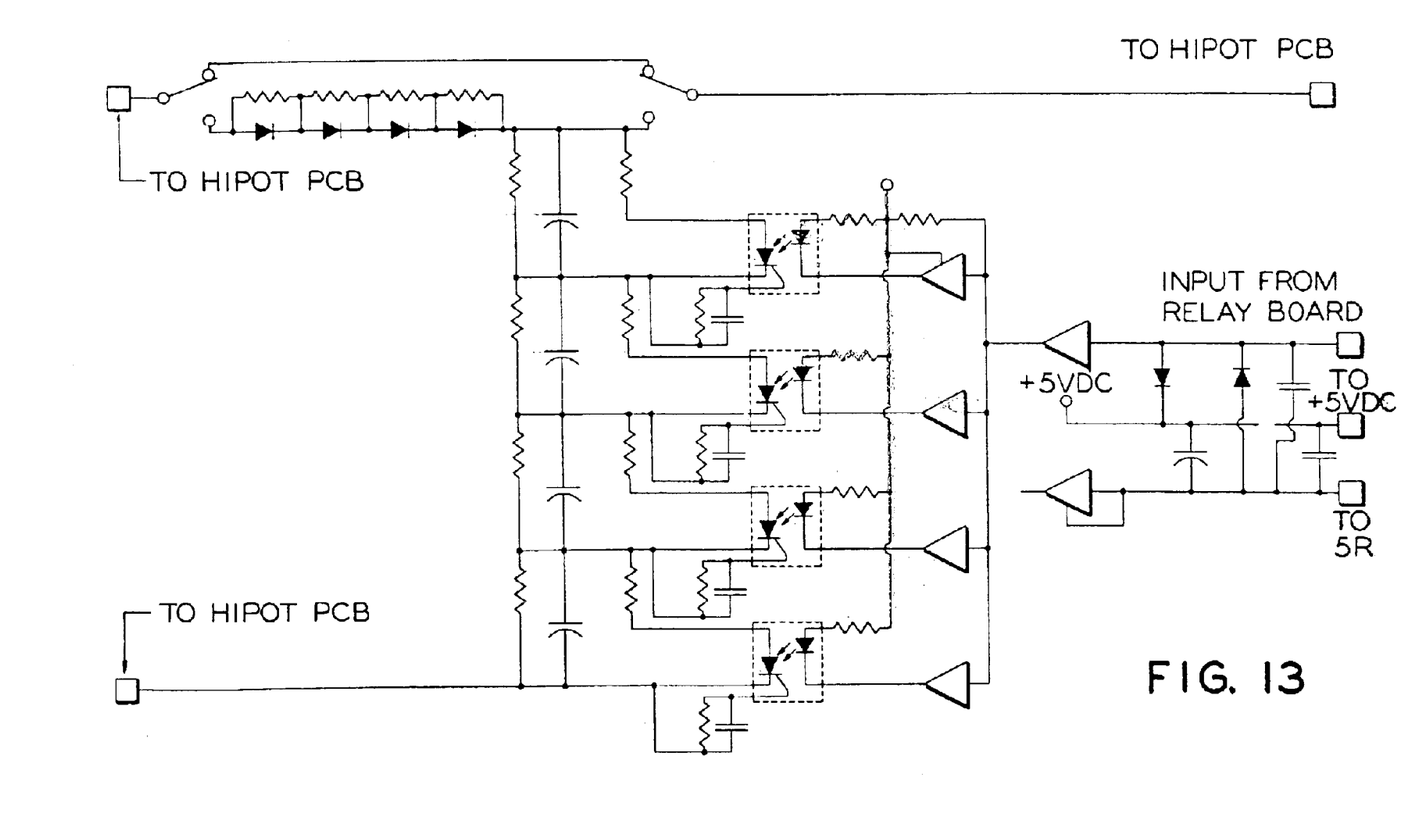
FIG. 13 is an electrical schematic of hi-pot means.

The cpu 20 includes a floppy drive 16, a hard drive 24, an analog to digital (A/D) printed circuit board 22, and three digital I/O printed circuit boards 18. Connected to the cpu 20 is a data entry means 14, usually a keyboard, for entering predetermined test parameters. Also connected to the cpu 20 is two visual display means. The first is a monitor 12, and the second is a printer 38.

The hi-pot means 26 is connected to the A/D printed circuit board 22 and to one of the three digital I/O printed circuit boards 18. The hi-pot means 26 provides a predetermined voltage of a predetermined magnitude to a multiplexer means 30. Such predetermined voltage is normally either an ac voltage or a direct current (dc) voltage, either of which have a range from about 0 volts to about 1500 volts.

The multiplexer means 30 is energized by the power supply means 28. It is also connected to one of the three digital I/O printed circuit boards 18, and to the hi-pot means 26 for receiving a predetermined voltage of a predetermined magnitude. The multiplexer means 28 is capable of communicating a predetermined voltage of a predetermined magnitude to about 240 circuits.

The apparatus also includes as many as 240 circuits. A predetermined number of these external circuits are connected to the multiplexer means for providing two-way communication of a predetermined quantity of signals.

The method for performing an automatic hi-pot, megohmeter and continuity circuit test includes the following steps. Providing a power source 42 to energize a cpu 20, a hi-pot means 26, and a power supply means 28. Test parameters are determined and entered into the cpu 20. The cpu 20 generates a digital control signal indicative of the test parameters and communicates this signal to the hi-pot means 26. The test parameters include any combination of a dc voltage hi-pot test, an ac voltage hi-pot test, a megohmeter test, and a continuity test.

The hi-pot means 26 generates an analog signal and communicates it to the analog to digital (A/D) printed circuit board 22. Upon converting the analog signal to a digital signal it is verified against predetermined test parameters. The hi-pot means 26 then generates a high voltage signal, and communicates this signal to a multiplexer means 30.

The multiplexer means 30 is used for two-way test communication with external circuitry 36. Such external circuitry 36 can be as little as a single wire up to 240 network circuits. It performs a predetermined test on these external circuits 36 and communicates either a pass or fail test result signal to one of the three digital I/O printed circuit boards 18.

The digital I/O printed circuit boards 18 generate a display signal and communicate this signal via the cpu 20 to either a monitor 12 or a printer 38. Finally, the test data can be stored on a floppy disk drive 16, a hard drive 24, a magnetic media, and a compact disc for retrieving data.

While both the presently preferred and a number of alternative embodiments of the present invention have been described in detail above it should be understood that various other adaptations and modifications of the present invention can be envisioned by those persons who are skilled in the relevant art of anti-lock brake systems without departing from either the spirit of the invention or the scope of the appended claims.

We claim:

1. An apparatus used to perform an automatic high potential (hi-pot), megohmeter and continuity, circuit test, said apparatus comprising:
   a) a power source;
   b) a central processing unit (cpu) connectable to said power source, said cpu containing (i) a floppy drive, (ii) a hard drive, (iii) an analog to digital (A/D) printed circuit board, and (iv) a predetermined number of digital I/O printed circuit boards;
   c) a data entry means connectable to said cpu for providing input into said cpu;
   d) a visual display means connected to said cpu for displaying predetermined data;
   e) a power supply means connected to said power source for providing a power supply;
   f) a hi-pot means connected to said power source and to said A/D printed circuit board and to at least one of said predetermined number of digital I/O printed circuit boards contained in said cpu for providing a predetermined voltage of a predetermined magnitude;
   g) a multiplexer means connected to said power supply and to at least one of said predetermined number of digital I/O printed circuit boards and said hi-pot means for receiving said predetermined voltage of a predetermined magnitude and for communicating a predetermined quantity of signals indicative of said predetermined voltage of a predetermined magnitude; and
   h) a predetermined number of external circuits connected to said multiplexer means for providing two-way communication of said predetermined quantity of signals.

2. An apparatus used to perform an automatic hi-pot, megohmeter and continuity, circuit test, according to claim 1, wherein said power source is a 120 volt alternating current (ac) power source.

3. An apparatus used to perform an automatic hi-pot, megohmeter and continuity, circuit test, according to claim 1, wherein said predetermined number of digital I/O printed circuit boards is at least one.

4. An apparatus used to perform an automatic hi-pot, megohmeter and continuity, circuit test, according to claim 1, wherein said predetermined number of digital I/O printed circuit boards is three.

5. An apparatus used to perform an automatic hi-pot, megohmeter and continuity, circuit test, according to claim 1, wherein said data entry means is a keyboard.

6. An apparatus used to perform an automatic hi-pot, megohmeter and continuity, circuit test, according to claim 1, wherein said visual display means is a monitor.

7. An apparatus used to perform an automatic hi-pot, megohmeter and continuity, circuit test, according to claim 1, wherein said visual display means is a printout.

8. An apparatus used to perform an automatic hi-pot, megohmeter and continuity, circuit test, according to claim 1, wherein said predetermined voltage is at least one of an ac voltage and a direct current (dc) voltage.

9. An apparatus used to perform an automatic hi-pot, megohmeter and continuity, circuit test, according to claim 1, wherein said predetermined magnitude ranges between about 0 volts and about 1500 volts.

10. An apparatus used to perform an automatic hi-pot, megohmeter and continuity, circuit test, according to claim 1, wherein said predetermined quantity of signals is at least one.

11. An apparatus used to perform an automatic hi-pot, megohmeter and continuity, circuit test, according to claim 1, wherein said predetermined quantity of signals is 240.

12. A method for performing an automatic hi-pot, megohmeter and continuity circuit test, said method comprising the steps of:
  a) providing a power source;
  b) connecting a cpu to said power source;
  c) connecting a hi-pot means to said power source;
  d) connecting a power supply means to said power source;
  e) determining test parameters;
  f) entering said test parameters determined in step (e) into said cpu;
  g) generating a digital control signal indicative of said test parameters within said cpu;
  h) communicating said digital control signal generated in step g) to said hi-pot means;
  i) generating an analog signal in said hi-pot means indicative of said digital control signal;
  j) communicating said analog signal generated in step i) to an A/D printed circuit board;
  k) verifying said analog signal;
  l) generating a digital signal with said A/D printed circuit board upon receipt of said analog signal;
  m) generating a high voltage signal within said hi-pot means indicative of said digital control signal;
  n) communicating said high voltage signal generated in step m) to a multiplexer means;
  o) utilizing said high voltage signal communicated in step n) to perform a predetermined test on an external circuit;
  p) generating a predetermined test result signal indicative of said predetermined test;
  q) communicating said predetermined test result signal generated in step p) to a predetermined digital I/O printed circuit board;
  r) generating a display signal upon receipt of said predetermined test result signal communicated in step q);
  s) communicating said display signal generated in step r) to a visual display means; and
  t) visually displaying test results.

13. A method for performing an automatic hi-pot, megohmeter and continuity circuit test, according to claim 12, wherein said test parameters in step e) include at least one of a dc voltage hi-pot test, an ac voltage hi-pot test, a megohmeter test, and a continuity test.

14. A method for performing an automatic hi-pot, megohmeter and continuity circuit test, according to claim 12, wherein said external circuit in step to) is at least one connection.

15. A method for performing an automatic hi-pot, megohmeter and continuity circuit test, according to claim 12, wherein said predetermined test result signal in step p) is at least one of a pass signal and a fail signal.

16. A method for performing an automatic hi-pot, megohmeter and continuity circuit test, according to claim 12, wherein said visual display means in step s) is a monitor.

17. A method for performing an automatic hi-pot, megohmeter and continuity circuit test, according to claim 12, wherein said visual display means, in step s) is a printout.

18. A method for performing an automatic hi-pot, megohmeter and continuity circuit test, according to claim 12, wherein said method further includes the step of at least one of saving and storing said test results on a predetermined media.

19. A method for performing an automatic hi-pot, megohmeter and continuity circuit test, according to claim 18, wherein said predetermined media is at least one of a hard drive, a magnetic media, a floppy disc, and a compact disc.

* * * * *

UNITED STATES PATENT AND TRADEMARK OFFICE
CERTIFICATE OF CORRECTION

PATENT NO.    : 6,815,956 B2
DATED         : November 9, 2004
INVENTOR(S)   : Weldin et al.

It is certified that error appears in the above-identified patent and that said Letters Patent is hereby corrected as shown below:

Column 6,
Line 30, "circuit in step to)" should read -- circuit in step o) --

Signed and Sealed this

Twenty-fourth Day of May, 2005

JON W. DUDAS
*Director of the United States Patent and Trademark Office*